(12) United States Patent
Nakayama et al.

(10) Patent No.: US 7,640,466 B2
(45) Date of Patent: Dec. 29, 2009

(54) SEMICONDUCTOR INTEGRATED CIRCUIT DEVICE INCORPORATING A DATA MEMORY TESTING CIRCUIT

(75) Inventors: Atsushi Nakayama, Kawasaki (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1145 days.

(21) Appl. No.: 11/012,190

(22) Filed: Dec. 16, 2004

(65) Prior Publication Data
US 2005/0276113 A1      Dec. 15, 2005

(30) Foreign Application Priority Data
Jun. 15, 2004   (JP)   ............... 2004-177163

(51) Int. Cl.
*G11C 29/00*   (2006.01)
(52) U.S. Cl. .............................. 714/718; 365/189.011
(58) Field of Classification Search ................ 711/163; 365/201, 189.011; 714/718, 719, 733, 738
See application file for complete search history.

(56) References Cited

U.S. PATENT DOCUMENTS

| | | | |
|---|---|---|---|
| 5,673,270 A * | 9/1997 | Tsujimoto | .................... 714/718 |
| 5,724,366 A * | 3/1998 | Furutani | ...................... 714/719 |
| 5,813,043 A * | 9/1998 | Iles et al. | ...................... 711/163 |
| 5,917,764 A | 6/1999 | Ohsawa et al. | |
| 5,999,457 A | 12/1999 | Sato | |
| 6,243,307 B1 * | 6/2001 | Kawagoe | ...................... 365/201 |
| 7,240,253 B2 * | 7/2007 | Yoshida et al. | .............. 714/718 |
| 2004/0205429 A1 * | 10/2004 | Yoshida et al. | .............. 714/718 |

FOREIGN PATENT DOCUMENTS

| | | |
|---|---|---|
| JP | 2-122500 | 5/1990 |
| JP | 4-19899 | 1/1992 |
| JP | 11-260095 | 9/1999 |
| JP | 2004-310918 | 11/2004 |
| JP | 2005-129174 | 5/2005 |

* cited by examiner

*Primary Examiner*—David Ton
(74) *Attorney, Agent, or Firm*—Oblon, Spivak, McClelland, Maier & Neustadt, L.L.P.

(57) ABSTRACT

A semiconductor integrated circuit device includes a data memory which stores write data, a holding circuit which holds the write data, a data write circuit which, during a write operation in a normal mode, supplies the write data held in the holding circuit to the data memory, and, during a write operation in a testing mode, inverts or does not invert the write data held in the holding circuit in accordance with an inversion control signal having a frequency substantially equal to a frequency of the write operation in the normal mode, and supplies the data to the data memory, and a data read circuit which outputs readout data from the data memory.

16 Claims, 4 Drawing Sheets

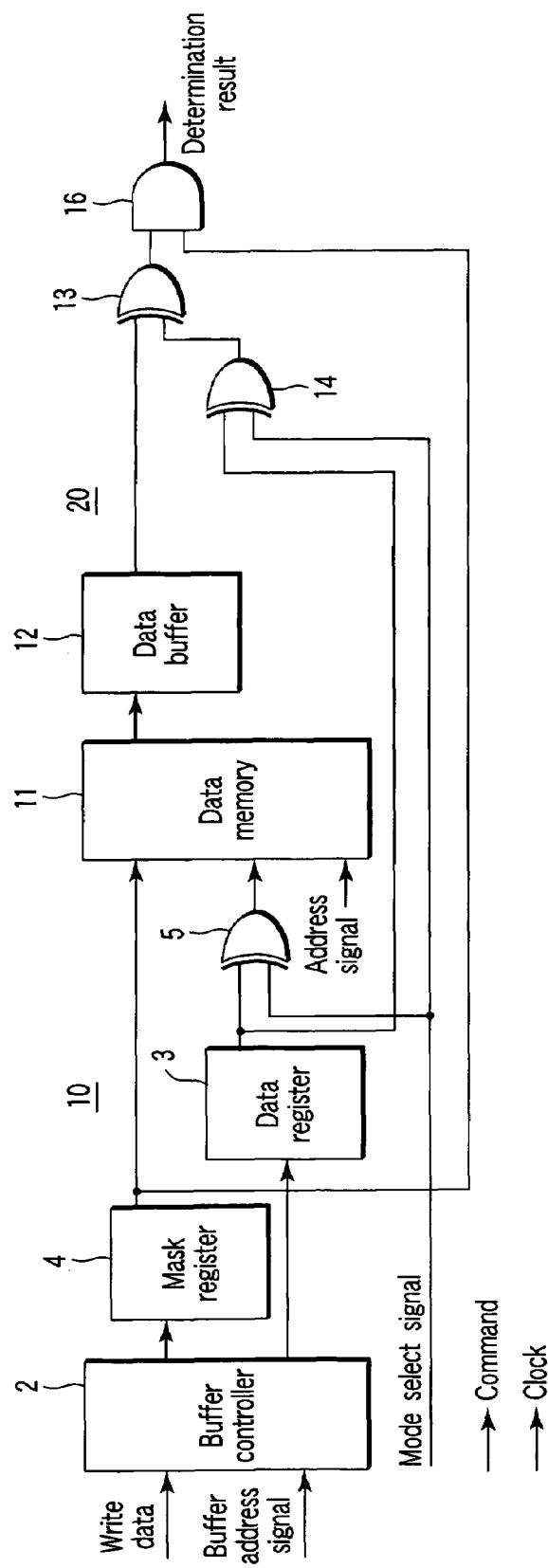
F I G. 3 ered. Furthermore, the inversion control signal is used as a signal for inverting data from the data register 3 and designating the inverted data as testing data during testing. However, this inversion control signal may also be used as a
SEMICONDUCTOR INTEGRATED CIRCUIT DEVICE INCORPORATING A DATA MEMORY TESTING CIRCUIT

CROSS-REFERENCE TO RELATED APPLICATIONS

This application is based upon and claims the benefit of priority from prior Japanese Patent Application No. 2004-177163, filed Jun. 15, 2004, the entire contents of which are incorporated herein by reference.

BACKGROUND OF THE INVENTION

1. Field of the Invention

The present invention relates to a semiconductor integrated circuit device incorporating a data memory testing circuit.

2. Description of the Related Art

As the amount of data stored in a data memory increases, a clock frequency used to determine the data write and read frequencies rises, and the operating speed also rises accordingly. To test the operation of a large-capacity, high-speed data memory, a testing apparatus must have a high-speed testing function matching the operating speed of the data memory. That is, during testing, expected value data is compared with write data supplied to the data memory or compared with data to be tested read out from the data memory. A high-speed data line is required to supply this expected value data at high speed to the data memory or to externally supply the expected value data. A testing apparatus configured like this is expensive.

Also, when an inexpensive testing apparatus is to be used, the clock frequency may be lowered. Therefore, the test of a large-capacity data memory is time-consuming and unable to find inconvenience which appears only during a high-speed operation.

An example of the conventional semiconductor integrated circuit device testing methods is described in Jpn. Pat. Appln. KOKAI Publication No. 11-260095. However, this reference only describes a testing method which generates a decrement address instruction inside a circuit on the basis of an increment address instruction which is externally supplied to a RAM, and does not mention any means for solving the conventional problems as described above.

BRIEF SUMMARY OF THE INVENTION

A semiconductor integrated circuit device according to an aspect of the present invention comprises:
 a data memory which stores write data,
 a holding circuit which holds the write data,
 a data write circuit which, during a write operation in a normal mode, supplies the write data held in the holding circuit to the data memory, and, during a write operation in a testing mode, inverts or does not invert the write data held in the holding circuit in accordance with an inversion control signal having a frequency substantially equal to a frequency of the write operation in the normal mode, and supplies the data to the data memory, and
 a data read circuit which outputs readout data from the data memory.

BRIEF DESCRIPTION OF THE SEVERAL VIEWS OF THE DRAWING

FIG. 3 is a block diagram showing the arrangement of the third embodiment in which the present invention is applied to a memory including a data write circuit and data read circuit;

DETAILED DESCRIPTION OF THE INVENTION

Embodiments of the present invention will be described in detail below with reference to the accompanying drawing.

Figure 1:
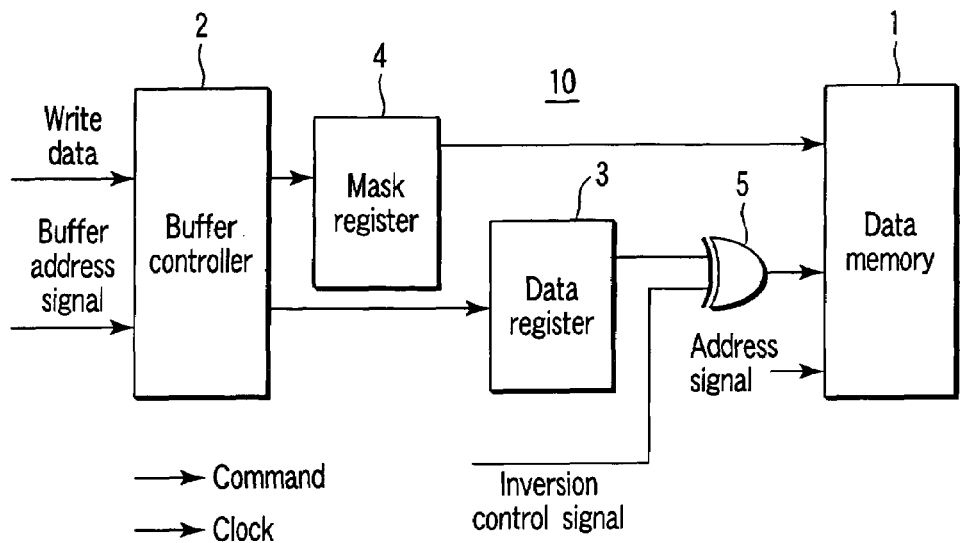
FIG. 1 is a block diagram showing the arrangement of the first embodiment in which the present invention is applied to a data write circuit of a memory.

FIG. 1 is a block diagram showing the overall arrangement of the first embodiment in which a semiconductor integrated circuit device is applied to a data write circuit 10 which writes data in a semiconductor memory or a data memory 1.

Referring to FIG. 1, write data to be stored in the data memory 1 is first supplied together with a buffer address signal to a buffer controller 2. Of the write data having a plurality of bits, the buffer controller 2 selectively supplies, to a data register 3, a data portion to be stored in the data memory 1, and supplies a mask address corresponding to a data portion to be masked to a mask register 4, on the basis of the supplied buffer address signal.

The data portion held in the data register 3 is supplied bit by bit to one input terminal of an inverter 5 which is an exclusive OR circuit with an inversion control terminal. An inversion control signal is supplied to the inversion control terminal composed of the other input terminal of the exclusive OR circuit 5. In this embodiment, this inversion control signal is at level L in a normal write mode in which the inverter 5 acts as a through path, so that the write data bit output from the data register 3 is supplied to the memory 1 without being inverted.

Since the address data corresponding to the data portion to be masked is held in the mask register 4, only the data portion to be stored except for this data portion to be masked is written in the data memory 1.

On the other hand, in a testing mode, the inversion control signal is at level H, so the write data bit from the data register 3 is inverted by the inverter 5 and supplied together with an address signal to the data memory 1. As in the normal write mode, the address data corresponding to the data portion to be masked is held in the mask register 4. Accordingly, of the write data inverted by the inverter 5, only the data portion to be stored except for the data portion to be masked is written as testing write data in the data memory 1 in accordance with the address signal. As described above, in both the normal write mode and testing mode, the mask address data latched by the mask register 4 is used to designate a data portion to be stored when data storage is performed for the data memory 1.

In this embodiment, a 1-bit high-speed inversion control signal at level H is used in data inversion. However, this inversion control signal may also be so set as to invert write data at level L. Also, although inverted write data is used in the testing mode in the above embodiment, uninverted write data may also be used. Furthermore, the inversion control signal is used as a signal for inverting data from the data register 3 and designating the inverted data as testing data during testing. However, this inversion control signal may also be used as a signal for designating uninverted data as testing data. This similarly applies to the other embodiments to be described later.

The data memory 1 used in this embodiment is a high-speed, large-capacity semiconductor memory. Therefore, the inversion control signal must also be a high-speed signal. This high-speed inversion control signal is externally supplied. However, it is possible to use a high-speed signal formed in the write circuit 10. For example, it is possible to use a high-speed bit signal selected from a plurality of bits forming the buffer address signal, a one-bit signal which changes to level L in the normal write mode and changes to level H in the testing mode, and use this one-bit signal as an inversion control signal.

The buffer address signal is used as an operation signal for the large-capacity, high-speed data memory 1 in the normal write mode. Accordingly, the same high-speed operation as in the normal write mode is guaranteed in the testing mode. That is, this buffer signal is a high-speed signal, and this makes it possible to obtain a signal capable of inversion control at the same speed as the write operation without additionally forming any high-speed signal line.

This obviates the need to form any external or internal high-speed signal source and signal line for testing and supply a signal to the data memory 1. Also, since various write data can be inverted and used as testing data, the contents of the testing data are not limited. This guarantees a high degree of testing freedom.

As the inversion control signal, it is also possible to use part of, e.g., an address signal or command signal for the data memory 1, or an externally formed existing high-speed control signal. Alternatively, a high-speed signal which designates a write mode and testing mode can be used. Since the control signal is a 1-bit signal, a bit signal usable as this signal may exist in many cases. This obviates the need to form any large-scale signal formation circuit for forming this signal and to form any high-speed signal line, and reduces the cost.

As indicated by the write circuit 10 shown in FIG. 1, a normal write operation can be performed only by controlling the inverter 5 by the inversion control signal, and testing data can be formed by using data preregistered in the data register 3 and supplied to the data memory 1. This can make the semiconductor integrated circuit device of this embodiment simple in arrangement and inexpensive. This also makes it possible to generate testing data at the same speed as a write operation in the normal mode, and supply the data to the high-speed, large-capacity data memory 1.

With this arrangement, testing data to be written in the data memory 1 during testing is preregistered, or expected value data, i.e., testing reference data to be compared with data read out from the data memory 1 during testing is preregistered. Whether to directly use this registered data or invert the data before it is used is designated by the inversion control signal which is a high-speed signal. Therefore, the testing data or expected value data can be simply and reliably prepared. This makes it possible to provide a semiconductor integrated circuit device having an arrangement capable of testing the operation of a data memory at low cost and high speed.

Figure 2:
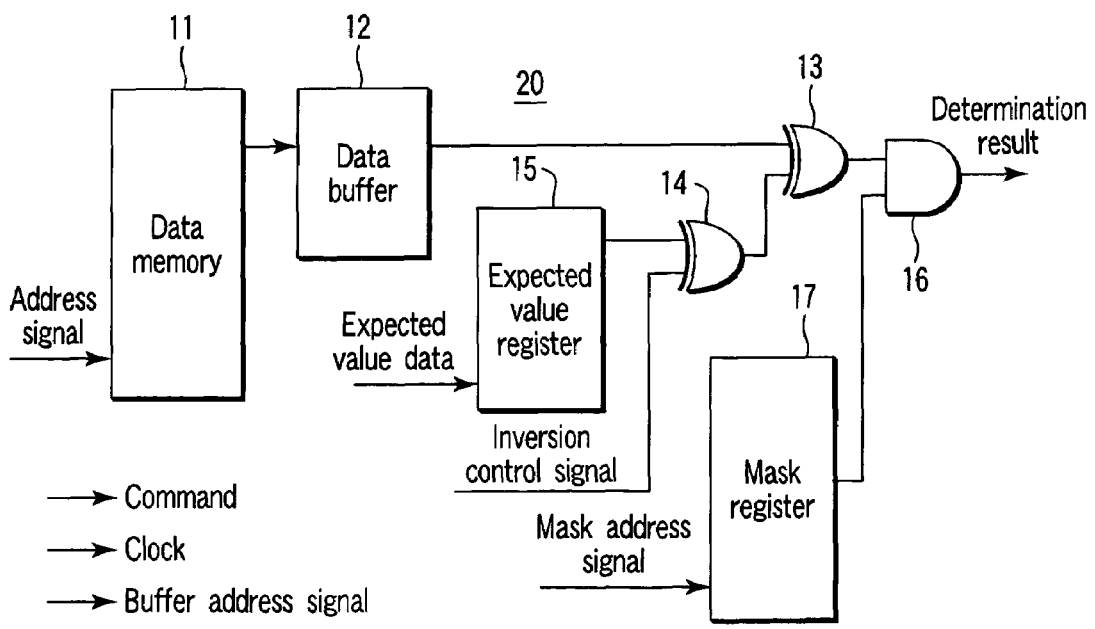
FIG. 2 is a block diagram showing the arrangement of the second embodiment in which the present invention is applied to a data read circuit of a memory.

FIG. 2 is a block diagram showing the overall arrangement of the second embodiment in which the semiconductor integrated circuit device of the present invention is applied to a data read circuit 20 which reads out data from a data memory in a testing mode.

Referring to FIG. 2, readout data which is read out from a data memory 11 in accordance with an address signal in a normal read mode is supplied bit by bit to one input terminal of a coincidence determination circuit 13 which is an exclusive OR circuit via a data buffer 12. An output from an inverter 14 which is also an exclusive OR circuit is supplied to the other input terminal of the coincidence determination circuit 13.

One input terminal of the inverter 14 is connected to the output terminal of an expected value register 15. In a testing mode of the data memory 11, expected value data as testing reference data for the readout data from the memory 11 as an object of testing is held in the expected value register 15 in advance. As the expected value data, the expected value register 15 holds, e.g., supplied write data to be stored in the data memory 11.

In the normal read mode, the expected value register 15 is inactivated by, e.g., a command, and level L always appears at the output terminal of the expected value register 15. Also, in the normal read mode, as in the first embodiment described above, an inversion control signal is set at level L, so the output of the inverter 14 is always at level L. Accordingly, the coincidence determination circuit 13 operates as a through path circuit in the normal read mode, and the data readout from the memory 11 to the data buffer 12 is directly supplied to one input terminal of a buffer address selector 16 which is an AND gate.

Mask address data is supplied to the other input terminal of the buffer address selector 16 via a mask register 17. Consequently, data to be masked is masked at the buffer address selector 16, and only the readout data necessary in the normal read mode is output from the buffer address selector 16.

Before the testing mode is set, expected value data which is testing reference data corresponding to the storage data as a testing object stored in the data memory 11 is held in the expected value register 15. This expected value data delivered from the expected value register 15 is supplied to one input terminal of the inverter 14. As the expected value data, data to be tested can be stored in the expected value register 15 when the data is written in the data memory 11.

Of a buffer address signal externally supplied as in the first embodiment shown in FIG. 1, a bit signal which changes to level L in the normal read mode and changes to level H in the testing mode is supplied as an inversion control signal to the other input terminal of the inverter 14. As a consequence, each bit of the expected value data output from the expected value register 15 is inverted by the inverter 14 and supplied to one input terminal of the coincidence determination circuit 13.

Each bit of the data to be tested is readout from the data memory 11 and supplied to the other input terminal of the coincidence determination circuit 13 via the data buffer 12. Therefore, when the two bits coincide as (1,1) or (0,0), the coincidence determination circuit 13 outputs (0) indicating false; if the two bits do not coincide, the coincidence determination circuit 13 outputs (1) indicating true. This determination output is supplied to the buffer address selector 16, and an AND operation with the mask address data stored in the mask register 17 is done. Consequently, the data to be masked is masked, and only the necessary readout data to be tested is output as a determination result signal.

Similar to the write circuit 10 of the first embodiment shown in FIG. 1, the coincidence determination circuit 13, inverter 14, expected value register 15, and mask register 17 are installed in the data read circuit 20 of the data memory 11 in the second embodiment. Accordingly, when the inversion control signal is prepared in the similar manner as in the first embodiment, the data readout from the data memory 11 can be easily tested at high speed with a simple circuit configuration.

FIG. 3 is a block diagram showing the overall arrangement of the third embodiment in which the semiconductor integrated circuit device is applied to a date write circuit 10 which writes data in a data memory 11 in a testing mode and to a data read circuit 20 which reads out data from the data memory 11 in the testing mode.

Referring to FIG. 3, write data supplied to a buffer controller 2 is masked by designation of a buffer address signal, and only the rest of the write data is supplied to a data register 3. Mask address data used in masking is supplied to a mask register 4.

The data output terminal of the data register 3 is connected to one input terminal of an inverter 5, and to one input terminal of an inverter 14 of the data read circuit 20. The inverters 5 and 14 are composed of an exclusive OR circuit. In this embodiment, therefore, the data register 3 is also used as the expected value register as shown in FIG. 2 in the data read circuit 20. Note that this embodiment shown in FIG. 3 is so set that data write operation to the data memory 11 and data read operation from the data memory 11 are not simultaneously performed.

A mode select signal is supplied as an inversion control signal to both the inverter 5 of the data write circuit 10 and the inverter 14 of the data read circuit 20. Similar to the embodiments shown in FIGS. 1 and 2, this mode select signal is formed on the basis of, e.g., one predetermined bit of a selected buffer address signal. The mask register 4 is also shared by the data write circuit 10 and data read circuit 20. That is, the mask address data from the mask register 4 is supplied to the data memory 11 and also supplied to the buffer address selector 16 to which the determination result of the inverter 13 is output.

In the normal write mode, the mode select signal is at level L, so the inverter 5 operates as a through path. Of the write data held in the data register 3, therefore, the mask data portion is masked by the mask address data, and only the necessary data is stored in the data memory 11.

In the testing mode, the mode select signal changes to level H, and the write data supplied from the data register 3 to the inverter 5 is inverted and stored in the data memory 11.

To test the data memory 11 in which data is written in the normal write mode, this data is read out from the data memory 11 and held in the data buffer 12. In the testing mode, the mode select signal is set at level H, so the exclusive OR circuit 14 operates as an inverter. As a consequence, each bit of the output data from the data register 3, which is used as expected value data, is inverted and supplied one by one to a coincidence determination circuit 13.

The coincidence determination circuit 13 compares bits of the readout data as data to be tested from the data buffer 12 one by one with bits of the inverted data from the inverter 14. If the two bits coincide, an output (0) is obtained as a "false" determination result output. If the two bits do not coincide, an output (1) is obtained as a "true" determination result output. This result data is selectively masked by the buffer address selector 16 in accordance with the mask address from the mask address data register 4, and only the necessary data portion is output via the buffer address selector 16. In the testing mode, the inverted bits of the data from the data register 3 is supplied as another input from the inverter 14.

It is also possible to test the data memory 11 by reading out inverted data stored in the data memory 11 in the testing mode. In this case, the output data from the inverter 14 is further inverted with respect to the readout data from the data buffer 12. Accordingly, the determination outputs from the coincidence determination circuit 13 are the same as in the above case. That is, if the two bits coincide, an output (0) is masked and output as a "false" determination result output via the buffer address selector 16; if the two bits do not coincide, an output (1) is masked and output as a "true" determination result output via the buffer address selector 16.

Figure 4:
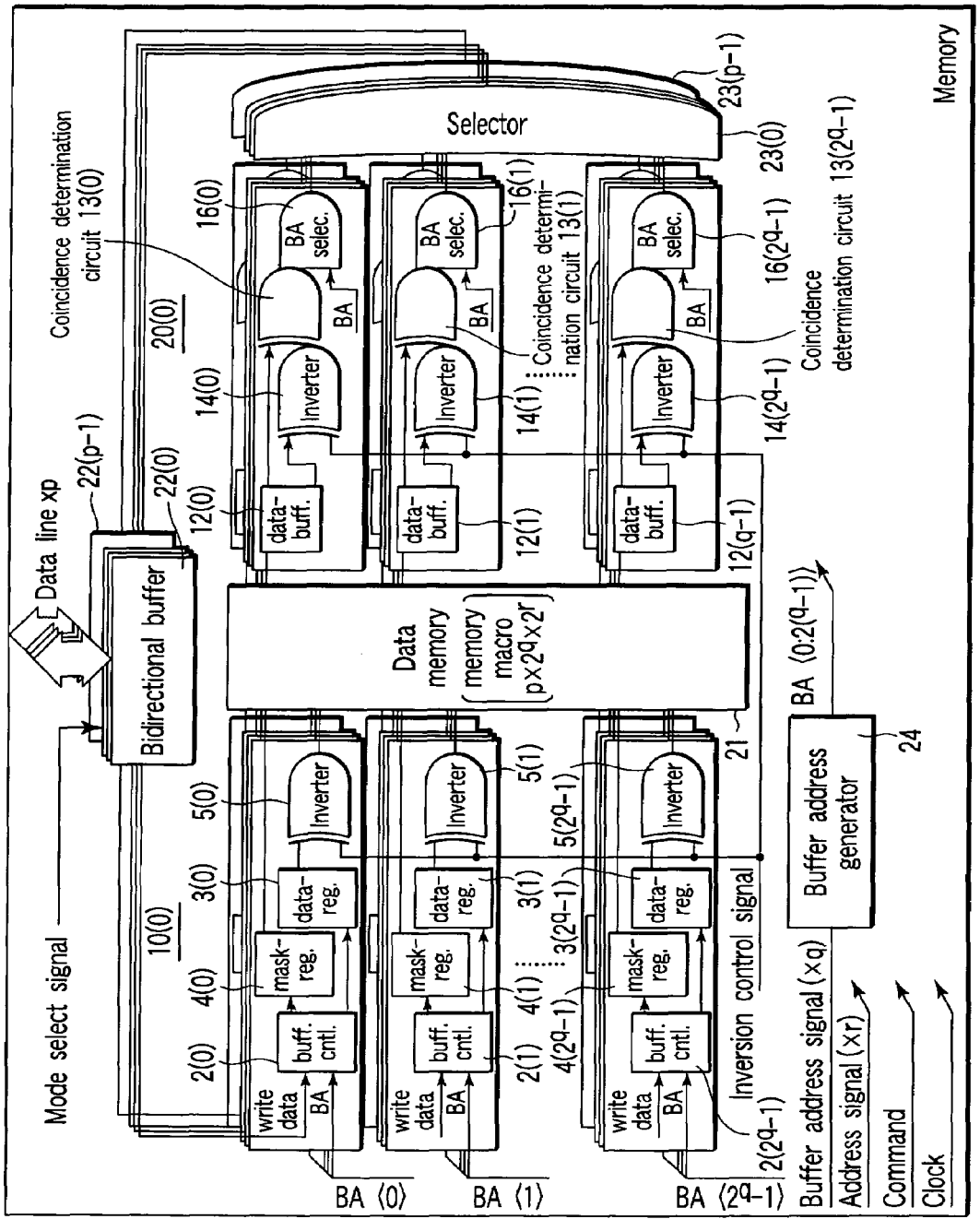
FIG. 4 is a block diagram showing the arrangement of the fourth embodiment in which the present invention is applied to a data memory made up of a plurality of memory cell array layers.

FIG. 4 is a block diagram showing the arrangement of still another embodiment of the present invention.

This embodiment shown in FIG. 4 basically has the similar function as the embodiment shown in FIG. 3. In this embodiment, a data memory 21 as a semiconductor memory macro has $2r$ addresses, and ($p \times 2q$)-bit data is stored at each address. The supply of the ($p \times 2q$)-bit data to the date memory 21 and the output of the ($p \times 2q$)-bit data from the data memory 21 are done selectively by the q-bit buffer address and p data from the bi-directional buffers 22(0) to 22($p-1$).

Referring to FIG. 4, a write or read mode select signal as a command formed in the same manner as in the third embodiment is supplied to the control input terminal of each of the bi-directional buffers 22(0) to 22($p-1$). In this embodiment, when the mode select signal indicates a normal write mode, the bi-directional buffers 22(0) to 22($p-1$) function as input buffers, and do not function as output buffers. In a normal read mode, the bi-directional buffers 22(0) to 22($p-1$) function as output buffers, and do not function as input buffers. Also, when the mode select signal indicates a testing mode, the bi-directional buffers 22(0) to 22($p-1$) always function only as output buffers, and never function as input buffers.

First, the overall arrangement will be explained below. The bi-directional buffers 22(0) to 22($p-1$) are connected to an external circuit of the semiconductor integrated circuit device shown in FIG. 4 via p multiplex data lines equal in number to the p data bits. Therefore, the data memory 21 shown in FIG. 4 has a multilayered structure in which p memory cell arrays each having $2r$ addresses and having an input width of $2q$-bit structure are stacked. Therefore, the data memory 21 is a memory device having a ($p \times 2q \times 2r$)-bit structure with an input/output width of ($p \times 2r$) bits.

For example, a data write circuit 10(0) in the first memory cell array has $2q$ buffer controllers 2(0) to 2($2q-1$) to which different buffer address signals are supplied, $2q$ mask registers 4(0) to 4($2q-1$), $2q$ data registers 3(0) to 3($2q-1$), and $2q$ inverters 5(0) to 5($2q-1$) between the output side of the first-layer bi-directional buffer 22(0) and the data memory 21. The connections of these components are the same as in the embodiment of FIG. 1.

Likewise, a data read circuit 20(0) in the first-layer memory cell array is connected to the data memory 21 and has $2q$ data buffers 12(0) to 12($2q-1$), $2q$ inverters 14(0) to 14($2q-1$), $2q$ coincidence determination circuits 13(0) to 13($2q-1$), and $2q$ buffer address selectors 16(0) to 16($2q-1$) to which different buffer address signals are supplied as mask address signals. The connections of there components are the same as in the embodiment of FIG. 2. The output terminals of the first-layer buffer address selectors 16(0) to 16($2q-1$) are connected to a first-layer selector 23(0) of p selectors 23(0) to 23($p-1$), and connected to the bi-directional buffer 22(0) of first layer.

Data write circuits 10(1) to 10($p-1$) and data read circuits 20(0) to 20($p-1$) are connected, in the similar manner, to the second-layer to p-th layer memory cell arrays, respectively.

An externally supplied q-bit buffer address signal is supplied to a buffer address generator 24, and $2q$ buffer address signals BA(0) to BA($2q-1$) are formed and used to control the data write circuits 10(0) to 10($p-1$) and data read circuits 20(0) to 20($p-1$).

Figure 5:
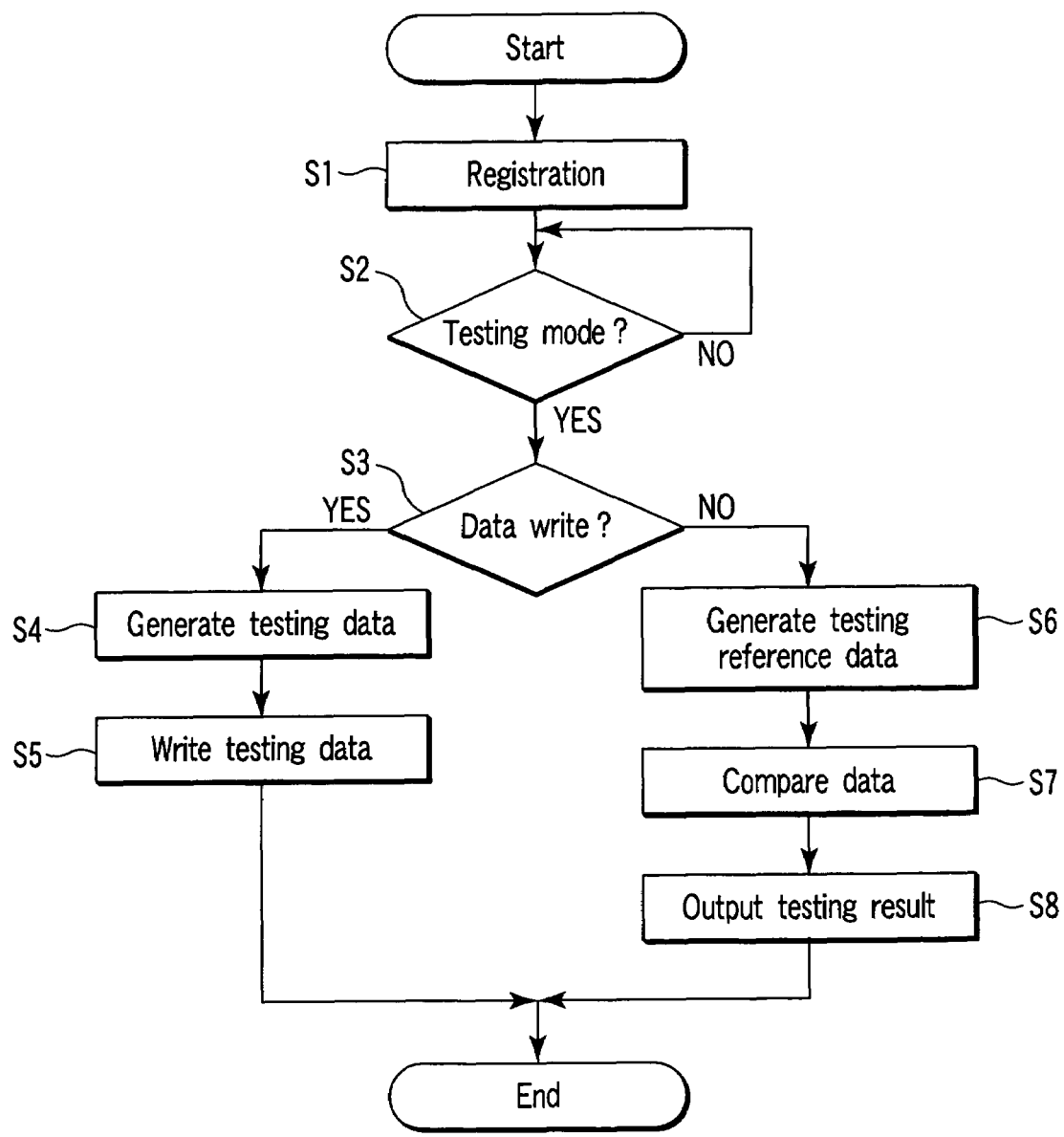
FIG. 5 is a flowchart for explaining the operation of the embodiment shown in FIG. 4.

The operation of the embodiment shown in FIG. 4 will be described below with reference to a flowchart shown in FIG. 5. As an example, the data write circuit 10(0) and data read circuit 20(0) connected to the first-layer memory cell array will be explained. First, in step S1, two types of registration are performed prior to testing.

(1) mask address registration to the mask registers 4(0) to 4(2q−1), and (2) write data registration to the data registers 3(0) to 3(2q−1).

In this state, the issue of buffer addresses from the buffer address generator 24 is stopped, and a buffer address signal inputted from an external circuit is made invalid.

When the mask address registration to the mask registers 4(0) to 4(2q−1) is made, a plurality of mask registers of 2q mask registers is made invalid, so that the activation ratio during testing can be raised, and the testing time can be reduced (to be described later). In this embodiment, the registration of the mask addresses to the mask registers are done directly in accordance with mask addresses supplied from an external device of the integrated circuit device. Further, for example, it is also possible to allocate a command which functions to register a mask address to a mask register to use a retired or used buffer address signal which has been used to designate its originally aimed bugger address. The buffer address signal may be used to register the data stored in the bi-directional buffers 22(0) to 22(p−1) to a mask register.

Next, write data is registered in the data registers 3(0) to 3(2q−1). The object of the write data registration is to make enable an access speed test with respect to the data memory 21 by fixing the function of the bi-directional buffers in a data output mode when the memory device is tested (which will be described later in detail). In this embodiment, the write data being registered to the data registers are supplied directly from an external device of the integrated circuit device. Further, for example, it is also possible to allocate a command which functions to register the write data to a data register to use a retired buffer address signal which has been used to designate its originally aimed buffer address. The buffer address signal may be used to register the data stored in the bi-directional buffers 22(0) to 22(p−1) to a data register.

Subsequently, in step S2, whether the operation mode is the testing mode is checked. If the operation mode is the normal mode, NO is determined in step S2, and the check is performed until the testing mode is set. If the operation mode is the testing mode, YES is determined in step S2, and the flow advances to step S3 to check whether to perform a testing data write operation or a testing data read operation in the testing mode.

The operation in the testing mode will be explained below. In this state, the bi-directional buffer 22(0) is normally set in an output state. Also, a buffer address signal is not used to generate any address signal, but is used as an inversion control signal.

As described previously in connection with the operation of the bi-directional buffer 22(0), the four normal data write and read operations of the data memory 21 include:

(1) write data loading
(2) data writing
(3) data reading
(4) readout data outputting Of these four operations, operations (1) and (4) are not performed in the testing mode. Of various input signals to the whole circuit shown in FIG. 4, buffer address signals are unnecessary, and inversion control signals to inverters are necessary. Accordingly, as a mode select signal, i.e., an inversion control signal for obtaining inverted data which is a high-speed signal, it is wise to use one bit of a buffer address signal as in the embodiments shown in FIGS. 1 to 3. Also, any of the bi-directional buffers 22(0), . . . , 22(q−1) does not need the function of an input data path in the testing mode. Therefore, the bi-directional buffers 22(0), . . . , 22(q−1) need only be so set as to have a function of always outputting a signal regardless of the control of a command signal. With this setting, the output time of data from the data memory 21 can also be checked. This makes it possible to perform testing of the time margin of a high-speed operation, which is conventionally impossible due to the operation mode switching time of the bi-directional buffers.

Of the four operations described above, (2) data writing (registration) operation, and
(3) data reading operation in the testing mode of the embodiment shown in FIG. 4 will be explained below.

If it is determined in step S3 that the testing data write operation is designated, the flow advances to step S4 to generate testing data. That is, write data held in the data registers 3(0) to 3(2q−1) is exclusively ORed with an inversion control signal as a mode select signal at level H to generate testing data. In step S5, only inverted data regarded as valid by mask data held in the mask registers 4(0) to 4(2q−1) is written in the first layer memory cell array of the data memory 21.

Accordingly, the contents of write data to be tested can be changed by inversion in response to an inversion control signal whenever a write operation is performed. Generally, to efficiently advance testing, it is desirable to change the contents of signals on signal lines close to each other. One method is to set data line addresses in each memory cell array to be lower significant position than its buffer addresses. By contrast, signal lines which change their operations in accordance with changes in buffer addresses must be physically separated. Design for assuring this distance is generally easily performed.

In the remaining second to p-th memory cell arrays, buffer address registration to the mask registers and write data registration to the data registers are performed in the same manner as above.

The operation of the data read circuit 20(0) will be described below. If NO is obtained in step S3, the flow advances to step S6 to generate testing reference data. That is, as in the embodiment shown in FIG. 3, data prestored in the data registers 3(0), . . . , 3(2q−1) of the data write circuit 10(0), which also function as expected value registers are exclusively ORed with inversion control signals by the inverters 14(0), . . . , 14(2q−1), thereby generating testing reference data. After that, in step S7, the coincidence determination circuits 13(0), . . . , 13(2q−1) compare this testing reference data with data read out from the first memory cell array of the data memory 21 to the data buffers 12(0), . . . , 12(2q−1), and the buffer address selectors 16(0), . . . , 16(2q−1) mask the comparison results by mask addresses. Finally, the comparison results are output from the data lines in step S8.

All the second to pth layer memory cell arrays are similarly tested. Since a plurality of internal buffer addresses are valid, true testing results are obtained only when the comparison results are correct at all valid internal buffer addresses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a data memory which stores write data;
a holding circuit which holds the write data;
a data write circuit which, during a write operation in a normal mode, supplies the write data held in the holding circuit to the data memory, and, during a write operation in a testing mode, inverts or does not invert the write data held in the holding circuit in accordance with an inversion control signal having a frequency substantially equal to a frequency of the write operation in the normal mode, and supplies the data to the data memory; and a data read circuit which outputs data readout from the data memory, wherein one bit of a write operation signal in the normal mode is supplied as the inversion control signal in the testing mode to the data write circuit.

2. A device according to claim 1, which further comprises a mask register which designates a mask address in the data memory, and wherein the write data is stored in the data memory after a portion of the write data is masked by the mask address.

3. A device according to claim 1, wherein the holding circuit is further configured to receive the write data which is used to test the data memory.

4. A semiconductor integrated circuit device comprising:

a data memory which stores data and outputs readout data;

a holding circuit which receives and holds testing reference data used to test the data memory;

a data read circuit which, during a read operation in a normal mode, outputs the readout data to an external circuit, and, during a read operation in a testing mode, inverts or does not invert one of the readout data and testing reference data in accordance with an inversion control signal having a frequency substantially equal to a frequency of the read operation in the normal mode, compares the two data, and outputs a comparison result to the external circuit, wherein the holding circuit holds write data to be written in the data memory as the testing data, and one bit of a read operation signal in the normal mode is supplied as the inversion control signal in the testing mode to the data read circuit.

5. A device according to claim 4, which further comprises a mask register which designates a mask address in the data memory, and wherein the result of comparison of the readout data from the data memory with the testing reference data is output as a determination result after a portion of the comparison result is masked by the mask address.

6. A device according to claim 4, wherein the holding circuit is further configured to hold write data that is stored in the data memory and which is the same as the testing reference data.

7. A semiconductor integrated circuit device comprising:

a data memory which stores write data;

a holding circuit which holds the write data;

a data write circuit which, during a write operation in a normal mode, supplies the write data held in the holding circuit to the data memory, and, during a write operation in a testing mode, inverts or does not invert the write data held in the holding circuit in accordance with a first inversion control signal having a frequency substantially equal to a frequency of the write operation in the normal mode, and supplies the data to the data memory; and a data read circuit which, during a read operation in a normal mode, outputs readout data from the data memory to an external circuit, and, during a read operation in a testing mode, inverts or does not invert the write data, held in the holding circuit and used as testing reference data, in accordance with a second inversion control signal having a frequency substantially equal to a frequency of the read operation in the normal mode, compares the write data with the readout data, and outputs a comparison result to the external circuit, wherein the data write circuit comprises a circuit configured to supply one bit of a write operation signal in the normal mode as the first inversion control signal in the testing mode.

8. A device according to claim 7, which further comprises a mask register which designates a mask address in the data memory, and wherein during data write in the testing mode, the write data is written in the data memory after a portion of the write data is masked by the mask address, and, during data read in the testing mode, the readout data from the data memory is output after a portion of the readout data is masked by the mask address.

9. A device according to claim 7, wherein the data write circuit and data read circuit comprise mode select signal lines to which a common mode select signal is supplied, and inverters to which the mode select signal is supplied as the first and second inversion control signal, respectively.

10. A device according to claim 9, wherein the inverter includes an exclusive OR circuit.

11. A device according to claim 7, which further comprises a bi-directional buffer circuit, and wherein the data write circuit and data read circuit are connected to an external data line via the bi-directional buffer circuit.

12. A device according to claim 7, wherein the data memory is a memory macro having a multi-layered hierarchical structure.

13. A semiconductor integrated circuit device comprising:

a data memory which stores write data;

a holding circuit which holds the write data;

a data write circuit which, during a write operation in a normal mode, supplies the write data held in the holding circuit to the data memory, and, during a write operation in a testing mode, inverts or does not invert the write data held in the holding circuit in accordance with a first inversion control signal having a frequency substantially equal to a frequency of the write operation in the normal mode, and supplies the data to the data memory; and a data read circuit which, during a read operation in a normal mode, outputs readout data from the data memory to an external circuit, and, during a read operation in a testing mode, inverts or does not invert the write data, held in the holding circuit and used as testing reference data, in accordance with a second inversion control signal having a frequency substantially equal to a frequency of the read operation in the normal mode, compares the write data with the readout data, and outputs a comparison result to the external circuit, wherein one bit of a read operation signal in the normal mode is supplied as the second inversion control signal in the testing mode to the data read circuit.

14. A semiconductor integrated circuit device comprising:

means for holding, in the semiconductor integrated circuit device, write data to be written in a data memory formed in the semiconductor integrated circuit device;

means for supplying the held write data to the data memory during a write operation in a normal mode;

means for inverting or not inverting the held write data in accordance with a first inversion control signal having a frequency substantially equal to a frequency of the write operation in the normal mode, and supplying the write data to the data memory, during a write operation in a testing mode;

means for outputting readout data from the data memory to an external circuit during a read operation in the normal mode; and means for inverting or not inverting the held write data as testing reference data in accordance with a second inversion control signal having a frequency substantially equal to a frequency of the read operation in the normal mode, comparing the write data with the readout data, and outputting a comparison result to an external circuit, during a read operation in the testing mode, wherein one bit of a write operation signal in the normal mode is supplied as the first inversion control signal in the testing mode or one bit of a read operation signal in the normal mode is supplied as the second inversion control signal in the testing mode.

15. A method of testing a data memory formed in a semiconductor integrated circuit device, comprising:

holding, in the semiconductor integrated circuit device, write data to be written in a data memory formed in the semiconductor integrated circuit device;

supplying the held write data to the data memory during a write operation in a normal mode;

inverting or not inverting the held write data in accordance with a first inversion control signal having a frequency substantially equal to a frequency of the write operation in the normal mode, and supplying the write data to the data memory, during a write operation in a testing mode;

outputting readout data from the data memory to an external circuit during a read operation in the normal mode; and inverting or not inverting the held write data as testing reference data in accordance with a second inversion control signal having a frequency substantially equal to a frequency of the read operation in the normal mode, comparing the write data with the readout data, and outputting a comparison result to an external circuit, during a read operation in the testing mode, wherein one bit of an operation signal used during the write and read operations in the normal mode in the semiconductor integrated circuit device is used as the first and second inversion control signals.

16. A method according to claim 15, wherein a portion of the held write data is stored as testing data in the data memory during the write operation in the testing mode, and a portion of the comparison result is used as a determination result during the read operation in the testing mode.

* * * * *